United States Patent
Wang et al.

(10) Patent No.: US 9,820,381 B2
(45) Date of Patent: Nov. 14, 2017

(54) SEMI-FINISHED PRODUCT FOR THE PRODUCTION OF A PRINTED CIRCUIT BOARD AND METHOD FOR PRODUCING THE SAME

(71) Applicant: AT&S Austria Technologie & Systemtechnik Aktiengesellschaft, Leoben (AT)

(72) Inventors: Vic Wang, An Kang (CN); Ethan Zhou, Kunshan (CN); Laura Bai, Guangzhou (CN); Mikael Tuominen, Shanghai (CN); Al Chen, Shanghai (CN)

(73) Assignee: AT&S Austria Technologie Systemtechnik Aktiengesellschaft, Loeben (AT)

( * ) Notice: Subject to any disclaimer, the term of this patent is extended or adjusted under 35 U.S.C. 154(b) by 48 days.

(21) Appl. No.: 14/654,387

(22) PCT Filed: Dec. 20, 2013

(86) PCT No.: PCT/AT2013/050260
§ 371 (c)(1),
(2) Date: Jun. 19, 2015

(87) PCT Pub. No.: WO2014/100848
PCT Pub. Date: Jul. 3, 2014

(65) Prior Publication Data
US 2015/0334833 A1    Nov. 19, 2015

(30) Foreign Application Priority Data

Dec. 31, 2012 (CN) .......................... 2012 1 0594386

(51) Int. Cl.
*H05K 7/10* (2006.01)
*H05K 7/12* (2006.01)
(Continued)

(52) U.S. Cl.
CPC ............. *H05K 1/111* (2013.01); *H05K 1/183* (2013.01); *H05K 3/46* (2013.01); *H05K 3/4697* (2013.01);
(Continued)

(58) Field of Classification Search
CPC .... H05K 3/4691–3/4697; H05K 1/183–1/188; H01L 24/18
(Continued)

(56) References Cited

U.S. PATENT DOCUMENTS 8,400,776 B2 * 3/2013 Sahara .................. H05K 1/183
174/259
2008/0264687 A1   10/2008 Park et al.
(Continued)

FOREIGN PATENT DOCUMENTS

EP          195935 A2     10/1986
JP        2010206124 A     9/2010
WO       2011099820 A2     8/2011

OTHER PUBLICATIONS

International Preliminary Report on Patentability for International Application No. PCT/AT2013/050260, Report issued Mar. 27, 2015, dated Mar. 27, 2015, 8 Pgs.
(Continued)

*Primary Examiner* — Tuan T Dinh
(74) *Attorney, Agent, or Firm* — KPPB LLP

(57) ABSTRACT

In a semi-finished product for the production of a printed circuit board with at least one recessed electronic component having at least one conductive layer structured to provide a connector pad for an electronic component, fan-out lines connected to the connector pad and further to provide at least one laser-stop device encompassing the connector pad, wherein the laser-stop device has at least one passage for passing-through the fan-out lines, the semi-finished product
(Continued)

Figure 1:
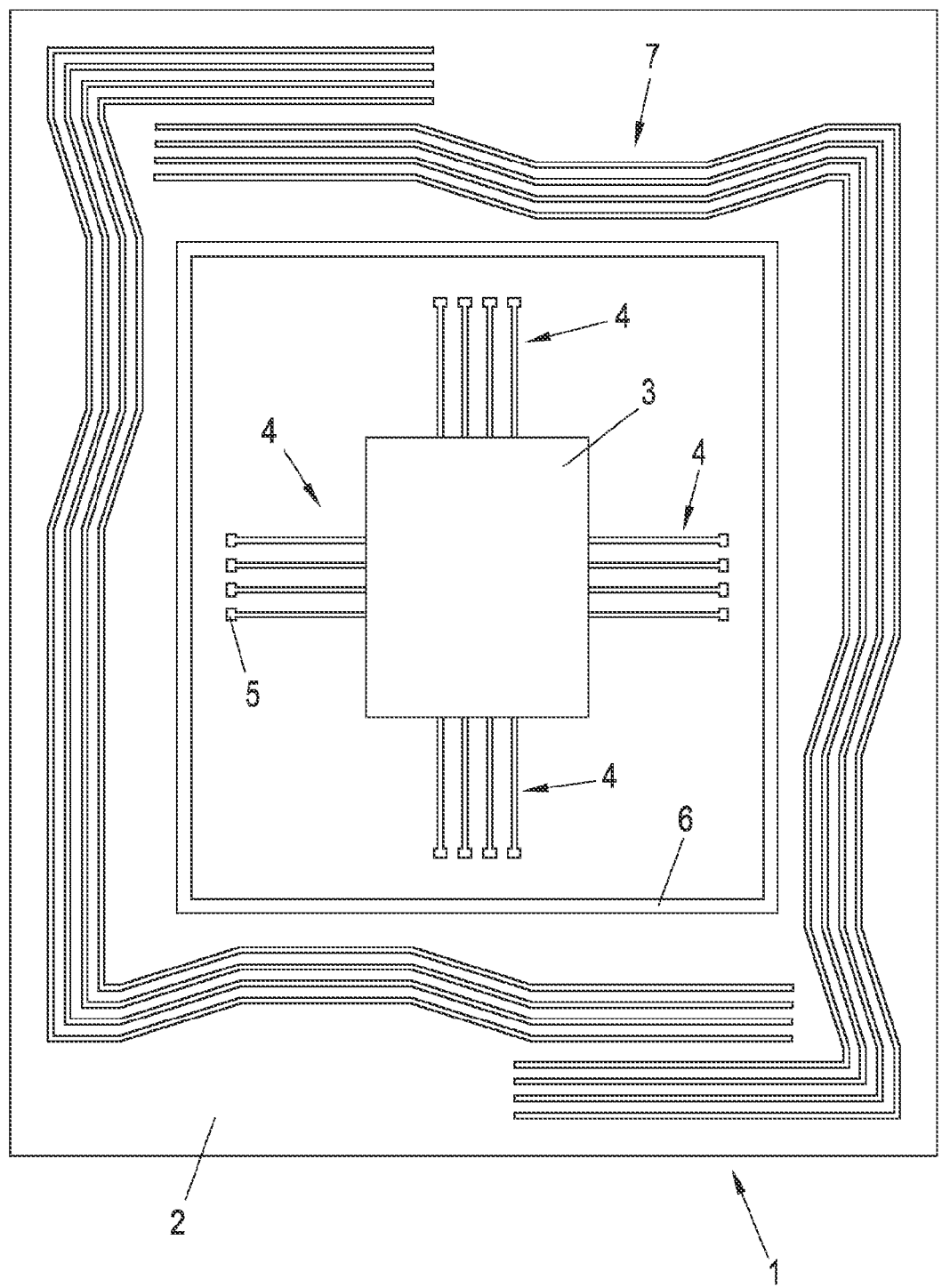

further comprises at least one cap layer applied to the conductive layer, the at least one cap layer having an opening in registration with each passage. The inventive method for producing a printed circuit board with at least one recessed component, is characterized by the steps of providing at least one conductive layer, structuring said conductive layer to provide a connector pad for an electronic component, fan-out lines connected to the connector pad and further to provide at least one laser-stop device encompassing the connector pad, leaving at least one passage in the laser-stop device for passing-through the fan-out lines, and applying a cap layer to said conductive layer, the cap layer having an opening in registration with each passage.

7 Claims, 4 Drawing Sheets

(51) Int. Cl.
    *H05K 1/11*     (2006.01)
    *H05K 3/46*     (2006.01)
    *H05K 1/18*     (2006.01)
    *H05K 3/00*     (2006.01)
(52) U.S. Cl.
    CPC . *H05K 3/0032* (2013.01); *H05K 2201/09127* (2013.01); *H05K 2201/09227* (2013.01); *H05K 2201/09781* (2013.01); *H05K 2201/10734* (2013.01); *H05K 2203/107* (2013.01)
(58) Field of Classification Search
    USPC .......................... 174/250–262; 361/760–767
    See application file for complete search history.

(56) References Cited

U.S. PATENT DOCUMENTS

| | | |
|---|---|---|
| 2010/0170703 A1 | 7/2010 | Iihola et al. |
| 2010/0252303 A1 | 10/2010 | Chang et al. |
| 2011/0203836 A1* | 8/2011 | Yokota ................... H01L 24/18 |
| | | 174/250 |
| 2011/0272177 A1 | 11/2011 | Weichslberger et al. |
| 2011/0284267 A1* | 11/2011 | Chang .................. H05K 3/4697 |
| | | 174/250 |
| 2012/0181074 A1* | 7/2012 | Ishihara ............... H05K 3/4691 |
| | | 174/261 |

OTHER PUBLICATIONS

International Search Report for International Application No. PCT/AT2013/050260, Search completed Apr. 29, 2014, dated May 13, 2014, 4 Pgs.

\* cited by examiner

SEMI-FINISHED PRODUCT FOR THE PRODUCTION OF A PRINTED CIRCUIT BOARD AND METHOD FOR PRODUCING THE SAME

BACKGROUND OF THE INVENTION

Field of the Invention

The invention relates to a semi-finished product for the production of a printed circuit board with at least one recessed electronic component having at least one conductive layer structured to provide a connector pad for an electronic component, fan-out lines connected to the connector pad and further to provide at least one laser-stop device encompassing the connector pad, wherein the laser-stop device has at least one passage for passing-through the fan-out lines as well as a method for producing a printed circuit board with at least one recessed component Description of the Related Art Printed circuit boards, also referred to as printed wire boards are panels carrying and electrically connecting electronic components such as transistors and the like and, hence, form vital parts of electronic products. Printed Circuit board have a more or less complex structure depending on the specific application. In general a printed circuit board has a plurality of alternating conductive layers and insulating layers bonded together by hardening panels of glass fibres impregnated with organic resin, said panels forming the insulating layers. Such panels for use in the production of printed circuit boards are widely known in the industry as "prepregs" (preimpregnated fibres), which are delivered and processed in an uncured, hence viscous state of the organic resin. The actual insulating layer of the printed circuit board results when the organic resin has cured. The insulating layers carry conductive layers, usually formed of copper foil, the conductive layers being appropriately structured to form wirings to electrically connect the electronic components. Modern printed circuit boards allow for a high degree of integration of electronic components and their appropriate wiring.

Starting from traditional printed circuit boards having the electronic components mounted on top of the board, today's electronic components have reached a degree of miniaturisation that allows for their accommodation within inner layers of the printed circuit board. To this end, the conductive layer that is destined to carry such a component or even many components, which layer is called target layer in the context of the present invention, is structured to provide a connector pad for the electronic component, such as for example a ball grid array. The connector pad is connected to so-called fan-out lines which are wirings connected to contacts of the connector pads leading away from the connector pad in order to connect the connector pad to the other wirings of the printed circuit board. In the course of the production of a highly integrated, multi-layered printed circuit board, the just described conductive layer is then covered with a plurality of further insulating layers and further conductive layers to form the multiple layers of the printed circuit board. Said further conductive layers are normally structured to provide wirings and can, of course, also be structured to provide additional connector pads for further recessed components. In the context of the present invention, the term "recessed component" means an electronic component received in a recess of a printed circuit board. At a later production step, the covered connector pads have to be uncovered or decapped in order to be able to place the component on the connector pad. This is usually done by laser-cutting. To this end, a $CO_2$ laser is deployed to cut through the insulating layers above the target layer. A $CO_2$ laser is advantageous for its nature not to cut through copper. In this context it is known in the art to provide an appropriate laser stop device for decapping a connector pad, the laser stop device being an area of copper surrounding the connector pad completely to be able to cut around the connector pad to completely liberate the at least one cap layer for subsequently removing it to reveal the connector pad. As a consequence, the fan-out lines were designed to stop right before the laser stop device since the laser stop device, also being made of conductive material, would otherwise bypass the fan-out lines if they crossed the laser stop device in the same conductive layer. The actual wiring of the fan-out lines to the rest of the printed circuit board was, hence, carried out in a conductive layer situated above the cap layer so that the laser stop device could be crossed. This, obviously, adds to the overall thickness of the printed circuit board. To overcome this problem, it is known to provide a passage in the otherwise closed laser stop device for passing-through the fan-out lines. Consequently, in the area of the passage in the laser stop device, cutting with laser is not possible, since the laser, in absence of a copper trace in the area of the passage, would cut through the underlying insulating layer(s). The cap layer, or the plurality of cap layers had to be cut otherwise or simply torn in the area where laser cutting could not have been performed due to the underlying passage in the laser stop device.

There is, however, a constant need for further miniaturisation in the electronic industry in order to provide consumers and professionals with ever smaller yet more capable electronic devices and installations which require more performance-oriented electronic components to be packaged in a smaller space. Such components require fan-out lines on all of its sides so that more uncut areas would remain in the at least one cap layer. However, the more uncut segments in the overlying insulating layer, i.e. the cap layer, the more difficult it becomes to decap the electronic component.

SUMMARY OF THE INVENTION

It is, thus, an object of the present invention to improve a semi-finished product of the initially mentioned kind to facilitate the removal of the at least one cap layer after incomplete laser cutting.

To achieve this object a semi-finished product of the initially mentioned kind is further developed such that the semi-finished product further comprises a cap layer applied to the conductive layer, the cap layer having an opening in registration with each passage. This means that the laser stop device is not completely surrounding the connector pad like a ring but is open to allow the fan-out lines to pass and be connected to the remaining wirings of the same conductive layer that carries the connector pad. The above described $CO_2$ laser must then be directed to only cut in the area of the laser stop device and the at least one cap layer having an appropriate number of, usually oblong, openings to span the distance of the at least one passage of the laser stop device can easily be removed.

For effective fan-out of high-performance electronic components it is desirable to have fan-out lines all around the connector pad and connect them more or less in a straight line to the wirings. To this end the invention is preferably devised such that the laser-stop device has four passages for passing-through the fan-out lines, the passages being arranged on each side of an imaginary rectangle formed by L-shaped segments of the laser-stop device and the at least one cap layer has four openings in registration with each passage. According to this preferred embodiment of the invention, the laser stop device, thus, is formed by four L-shaped segments surrounding the connector pad but leaving four passages for the fan-out lines. The $CO_2$ laser can cut the overlying cap layer in the area of the four L-shaped segments while the openings in the at least one cap layer in registration with the passages span the length of the passages of the laser stop device.

To further facilitate decapping of the connector pads the inventive semi-finished product is preferably devised such that said conductive layer is coated with a release layer in the region of the connector pad. Such release layers are commonly known and prevent the lamination or bonding process of a printed circuit board to effectively occur in the coated area so that the cap layer can easily be removed.

Preferably the release layer is formed by a material selected from the group comprised of metal soaps of Al, Mg, Ca, Na and Zn, combined with a binding agent and a solvent. With these materials, the cap layer can easily be separated from the carrier layer.

Preferably the cap layer is a prepreg, in particular a low-flow prepreg. Prepreg (preimpregnated fibres) is a material widely used in the electronic industry to build printed circuit boards. Prepreg is a semi-finished product of composite fibres with an epoxy resin. The fibres usually take the form of a weave or are uni-directional. They contain an amount of the resin material used to bond them together and also bond them to other components during manufacture. This material is readily available in the electronic industry and allows for a cheap production of the inventive semi-finished product. Low flow prepreg is prepreg material with a resin of high viscosity to prevent the resin in the at least one cap layer having the openings to flow into the openings and clogging them which would undo the benefits of the provisions of the openings in the cap layer.

The inventive method is characterised by the steps of providing at least one conductive layer, structuring said conductive layer to provide a connector pad for an electronic component, fan-out lines connected to the connector pad and further to provide at least one laser-stop device encompassing the connector pad, leaving at least one passage in the laser-stop device for passing-through the fan-out lines, and applying a cap layer to said conductive layer, the cap layer having an opening in registration with each passage.

The cap layer, being an insulating layer above the target layer will, thus, be precut to have an appropriate number of, usually oblong, openings to span the distance between the passages of the laser stop device.

This means that the laser stop device is not completely surrounding the connector pad like a ring but is open to allow the fan-out lines to pass and be connected to the remaining wirings of the same conductive layer that carries the connector pad. The above described $CO_2$ laser must then be directed to only cut in the area of the laser stop device and the at least one cap layer having an appropriate number of, usually oblong, openings to span the distance of the at least one passage of the laser stop device can easily be removed.

According to a preferred embodiment the inventive method is characterised by providing four passages for passing-through the fan-out lines, the passages being arranged on each side of an imaginary rectangle formed by L-shaped segments of the laser-stop device and the at least one cap layer having four openings in registration with the passages. The laser stop device, thus, is formed by four L-shaped segments surrounding the connector pad but leaving four passages for the fan-out lines. In a later production step, the $CO_2$ laser can cut the overlying insulating layer in the area of the four L-shaped segments leaving four uncut segments while the openings in the at least one cap layer in registration with the passages span the length of the passages of the laser stop device.

To further facilitate decapping of the connector pads the inventive method is preferably characterised by coating the conductive layer with a release layer in the region of the connector pad. Such release layers are commonly known and prevent the lamination or bonding process of a printed circuit board to effectively occur in the coated area so that the cap layer can easily be removed.

Preferably, the inventive method is characterised by using a prepreg, in particular a low-flow prepreg, for the cap layer. Prepreg (preimpregnated fibres) is a material widely used in the electronic industry to build printed circuit boards. Prepreg is a semi-finished product of composite fibres with an epoxy resin. The fibres usually take the form of a weave or are uni-directional. They contain an amount of the resin material used to bond them together and also bond them to other components during manufacture. This material is readily available in the electronic industry and allows for a cheap production of the inventive semi-finished product. Low flow prepreg is prepreg material with a resin of high viscosity to prevent the resin in the at least one cap layer having the openings to flow into the openings and clogging them which would undo the benefits of the provisions of the openings in the cap layer.

Figure 2:
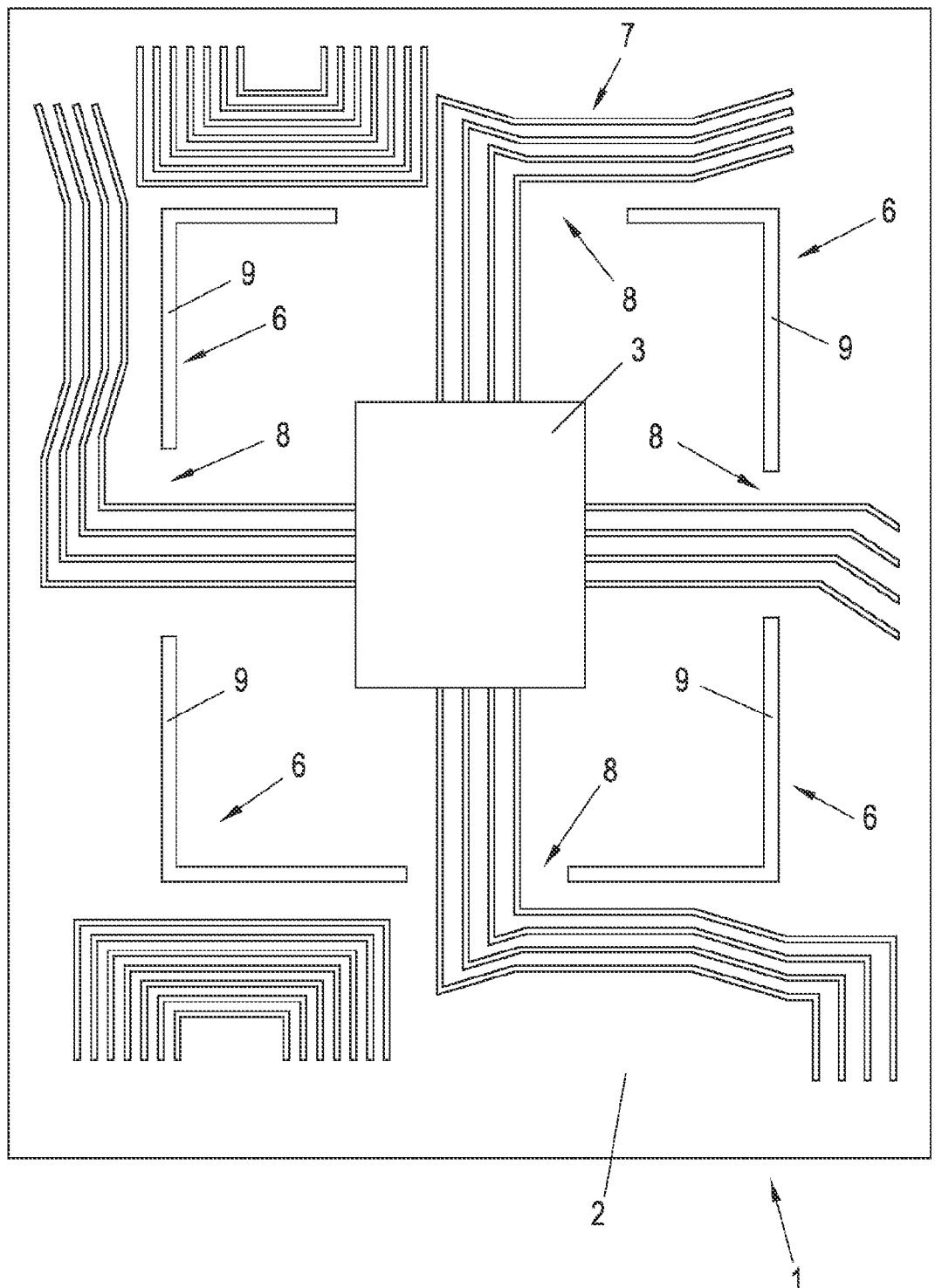
Figure 3:
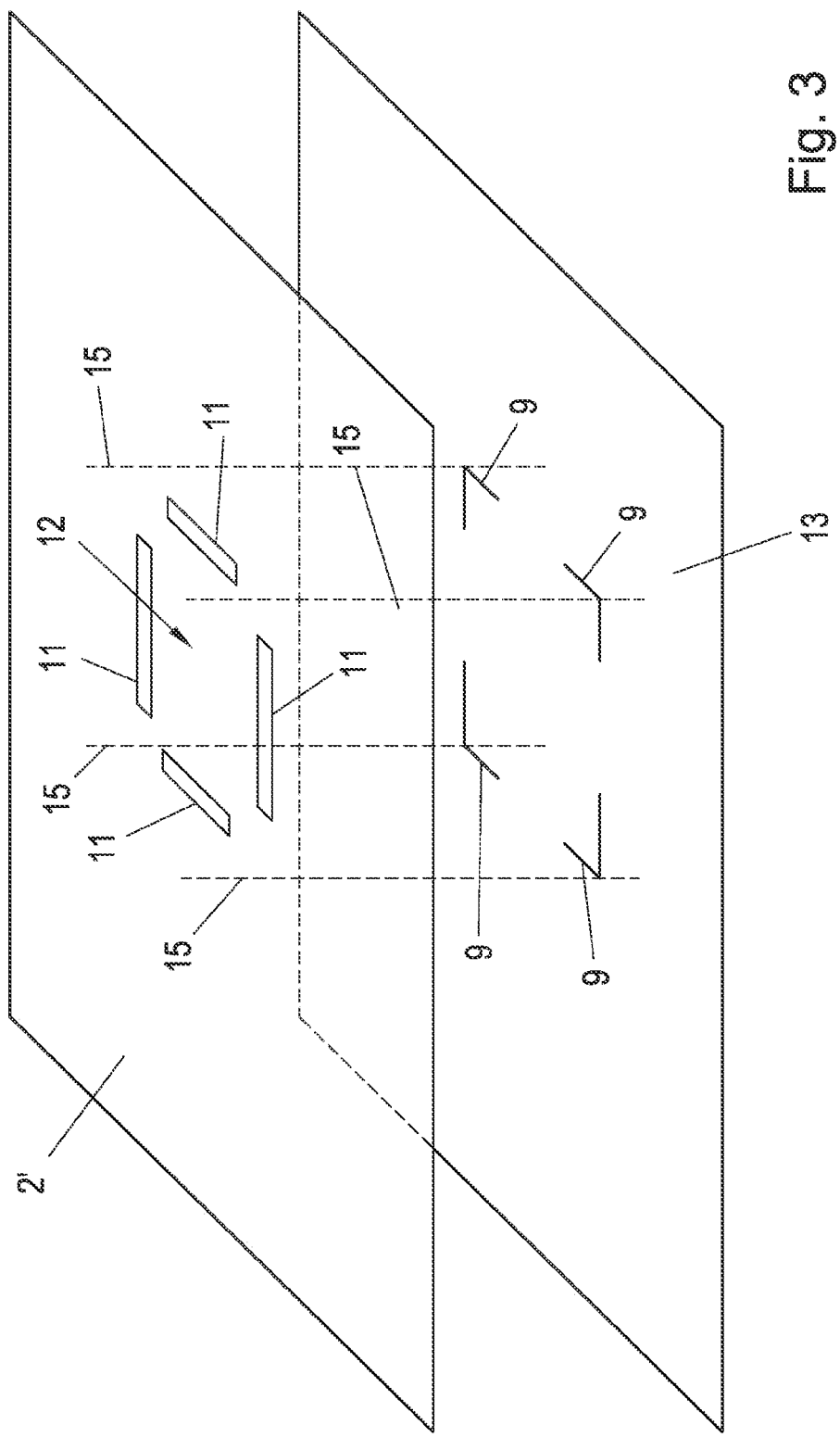

The invention will be described in more detail in the following in connection with the accompanying drawing, in which FIG. 1 shows a plan view of a conductive layer of a printed circuit board having a connector pad and a laser stop device according to the state of the art, FIG. 2 shows a plan view of a conductive layer of a printed circuit board having a connector pad and a laser stop device according to the invention FIG. 3 shows a perspective view of the conductive layer according to FIG. 2 and a cap layer having openings in registration with each passage in the laser stop device according to FIG. 2

Figure 4:
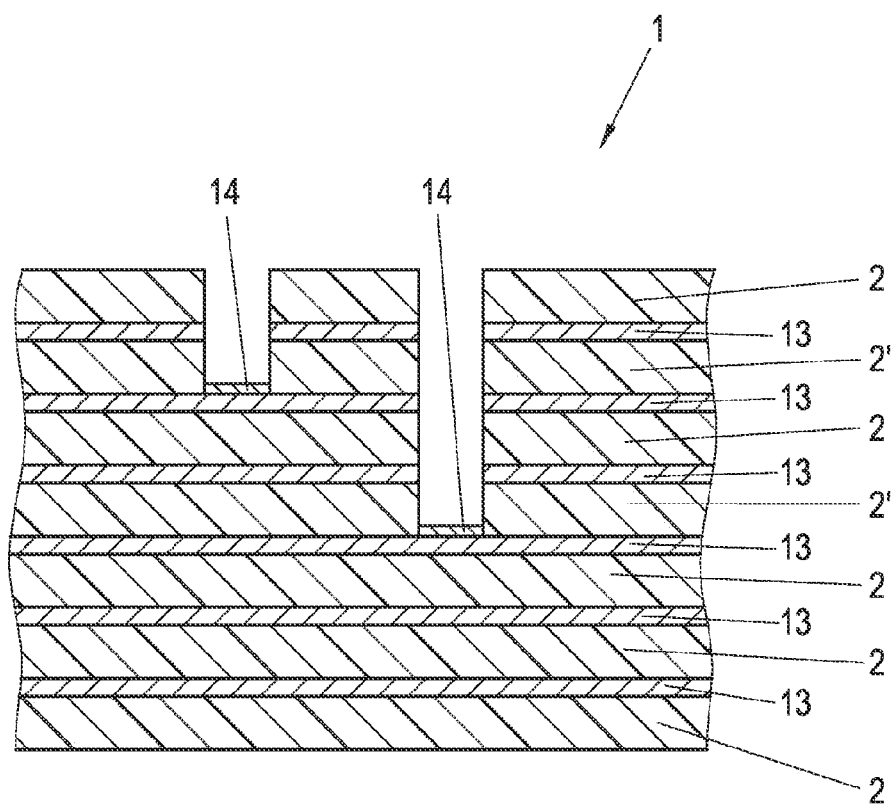

FIG. 4 shows a sectional view of a printed circuit board having two conductive layers structured according to the invention.

It is to be noted that in the drawings, the architecture of the wirings as well as the proportions of the connector pad, the fan-out lines or any other components of the semi-finished product or a printed circuit board resulting from the semi-finished product are depicted schematically and simplified and serve for the sole purpose of describing the principle of this invention.

In FIG. 1, the semi-finished product according to the state of the art denoted by reference numeral 1 basically consists of at least one insulating layer 2 and a conductive layer, which is structured to form a connector pad 3 for an recessed electronic component, fan-out lines 4 having contact pads 5, a laser stop device 6 and wirings 7 leading to further components in a printed circuit board. It can be seen that the laser stop device 6 completely surrounds the region of the connector pad 3 and leave no opening for the fan-out lines 4. The conductive material is copper so that a $CO_2$ laser would not cut through the laser stop device 6. It is therefore possible to cut an overlying cap layer and take the piece that is cut out away from the connector pad. The fan-out lines 4, hence, cannot reach out of the laser stop device 6 since they are made from the material of the conductive layer and would, therefore, be bypassed by the conductive material of the laser stop device 6. Therefore, it is not possible to connect the fan-out lines 4 to wirings 7 outside the laser stop device 6 in the same layer but only in a further conductive layer separated from the laser stop device 6 through a further insulating layer. This adds to the overall thickness of the semi-finished product 1 or a printed circuit board resulting from it.

According to the invention, the laser stop device 6 has at least one, in the embodiment depicted in FIG. 2 even four passages 8 for passing-through the fan-out lines 4. The fan-out lines 4 can pass through these passages 8 and be connected to the wirings 7 of the same conductive layer. Accordingly, a $CO_2$ laser can cut an overlying cap layer, i.e. the cap layer only in the region of the L-shaped segments so that the cap layer would remain uncut in the region of the passages 8.

As can be seen in FIG. 3, the cap layer 2' is provided with openings 11 which are in registration with each passage 8 as indicated by the dotted vertical lines 15 and span over the passages 8. When a $CO_2$ laser cuts through the cap layer 2' along the L-shaped segments 9 of the conductive layer carrying the connector pad 3 the cap 12 of the cap layer 2' will come loose and can easily be removed from the region of the connector pad 3 not depicted in FIG. 3. It is, however, obvious that the connector pad 3 lies in the area confined by the L-shaped segments 9. After the removal of the cap 12 an electronic component can be placed on the connector pad 3 and appropriately contacted.

In FIG. 4 it is shown that the semi-finished product 1 may consist of a plurality of insulating layers 2 and conductive layers 13. Each of the conductive layers 13 can be structured to form one or more connector pads 3, fan-out lines 4, contact pads 5, laser stop devices 6 and wirings 7. In order to facilitate decapping of the connector pads 3, the conductive layer of interest can be coated with a release layer 14 preventing the lamination or bonding process of a printed circuit board to effectively occur in the coated area so that the cap layer can easily be removed.

It is to be noted that in the context of the present invention the term "recessed component" is used for an electronic component being arranged on a layer of a printed circuit board within a recess of the printed circuit board as opposed to top-mounted electronic components. Whether or no the so-called recessed component is covered by other layers or resin at a later stage is irrelevant for the purpose of the present invention.

What is claimed is:

1. A semi-finished product for the production of a printed circuit board configured to receive at least one recessed electronic component, the said semi-finished product comprising:
    at least one conductive layer structured to provide a connector pad for a recessed electronic component, fan-out lines connected to the connector pad and further to provide at least one laser-stop device disposed about the periphery of the connector pad to partially encompass the connector pad,
    wherein the laser-stop device has at least one passage for passing-through the fan-out lines such that the fan-out lines are not overlapped by or in contact with any portion of the at least one laser-stop device, and the semi-finished product further comprises at least one cap layer applied to the conductive layer, the at least one cap layer having an opening, the opening is in registration with each passage,
    wherein the laser-stop device has four passages for passing-through the fan-out lines, the passages being arranged on each side of an imaginary rectangle formed by L-shaped segments of the laser-stop device, and the at least one cap layer has four openings in registration with the passages.

2. The semi-finished product according to claim 1 wherein said conductive layer is coated with a release layer in the region of the connector pad.

3. The semi-finished product according to claim 1, wherein the release layer is formed by a material selected from the group consisting of metal soaps of Al, Mg, Ca, Na and Zn, combined with a binding agent and a solvent.

4. The semi-finished product according to claim 1, wherein the cap layer is a prepreg, in particular a low-flow prepreg.

5. A method for producing a printed circuit board configured to receive at least one recessed component, characterized by the steps of comprising:
    providing at least one conductive layer,
    structuring said conductive layer to provide a connector pad for a recessed electronic component, fan-out lines connected to the connector pad and further to provide at least one laser-stop device disposed about the periphery of the connector pad to partially encompass the connector pad, leaving at least one passage in the laser-stop device for passing-through the fan-out lines such that the fan-out lines are not overlapped by or in contact with any portion of any of the at least one laser-stop devices, and
    applying a cap layer to said conductive layer, the cap layer having an opening in registration with each passage,
    wherein providing four passages for passing-through the fan-out lines, the passages being arranged on each side of an imaginary rectangle formed by L-shaped segments of the laser-stop device and the at least one cap layer having four openings in registration with the passages.

6. The method according to claim 5 wherein coating the conductive layer with a release layer in the region of the connector pad.

7. The method according to claim 5, wherein using a prepreg, in particular a low-flow prepreg, for the cap layer.

* * * * *